United States Patent
Goel et al.

(10) Patent No.: US 9,704,766 B2
(45) Date of Patent: Jul. 11, 2017

(54) INTERPOSERS OF 3-DIMENSIONAL INTEGRATED CIRCUIT PACKAGE SYSTEMS AND METHODS OF DESIGNING THE SAME

(75) Inventors: Sandeep Kumar Goel, San Jose, CA (US); Mill-Jer Wang, Hsinchu (TW); Chung-Sheng Yuan, Hsinchu (TW); Tom Chen, Hsinchu (TW); Chao-Yang Yeh, Luzhou (TW); Chin-Chou Liu, Jhubei (TW); Yun-Han Lee, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 193 days.

(21) Appl. No.: 13/118,201

(22) Filed: May 27, 2011

(65) Prior Publication Data

US 2012/0273782 A1 Nov. 1, 2012

Related U.S. Application Data

(60) Provisional application No. 61/480,117, filed on Apr. 28, 2011.

(51) Int. Cl.
*H01L 23/48* (2006.01)
*H01L 21/66* (2006.01)
*H01L 25/065* (2006.01)

(52) U.S. Cl.
CPC .......... *H01L 22/32* (2013.01); *H01L 25/0655* (2013.01); *H01L 2224/16225* (2013.01); *H01L 2924/10253* (2013.01); *H01L 2924/1305* (2013.01); *H01L 2924/13091* (2013.01); *H01L 2924/157* (2013.01); *H01L 2924/15192* (2013.01); *H01L 2924/15311* (2013.01)

(58) Field of Classification Search
CPC . G01R 3/00; H01L 2224/48463; H01L 22/32; H01L 25/0655; H01L 2224/16225; H01L 2924/15192; H01L 2924/15311; H01L 2924/157
USPC ........................... 257/48, 621, 691, 698, 737
See application file for complete search history.

(56) References Cited

U.S. PATENT DOCUMENTS

| | | | | |
|---|---|---|---|---|
| 5,765,279 | A * | 6/1998 | Moresco et al. | 29/840 |
| 6,434,016 | B2 * | 8/2002 | Zeng et al. | 361/760 |
| 6,461,895 | B1 * | 10/2002 | Liang | G11C 7/02 257/E23.067 |
| 6,534,853 | B2 * | 3/2003 | Liu et al. | 257/692 |
| 6,914,786 | B1 * | 7/2005 | Paulsen et al. | 361/790 |
| 7,164,149 | B2 * | 1/2007 | Matsubara | 257/48 |
| 7,400,134 | B2 * | 7/2008 | Morishita et al. | 324/762.02 |
| 7,576,435 | B2 * | 8/2009 | Chao | 257/778 |
| 7,843,042 | B2 * | 11/2010 | Kuan et al. | 257/660 |

(Continued)

*Primary Examiner* — Ori Nadav
(74) *Attorney, Agent, or Firm* — Hauptman Ham, LLP

(57) ABSTRACT

An interposer of a package system includes a first probe pad disposed adjacent to a first surface of the interposer. A second probe pad is disposed adjacent to the first surface of the interposer. A first bump of a first dimension is disposed adjacent to the first surface of the interposer. The first bump is electrically coupled with the first probe pad. A second bump of the first dimension is disposed adjacent to the first surface of the interposer. The second bump is electrically coupled with the second probe pad. The second bump is electrically coupled with the first bump through a redistribution layer (RDL) of the interposer.

20 Claims, 17 Drawing Sheets

(56) References Cited

U.S. PATENT DOCUMENTS

| | | | |
|---|---|---|---|
| 8,084,854 B2* | 12/2011 | Pratt et al. | 257/698 |
| 8,269,337 B2* | 9/2012 | Hu | H01L 23/36 257/698 |
| 8,283,209 B2* | 10/2012 | Camacho et al. | 438/109 |
| 8,357,931 B2* | 1/2013 | Schieck et al. | 257/48 |
| 8,421,073 B2* | 4/2013 | Lin | H01L 22/14 257/48 |
| 8,648,615 B2* | 2/2014 | Rahman | 324/754.09 |
| 2004/0056344 A1* | 3/2004 | Ogawa | H01L 21/6835 257/686 |
| 2004/0100293 A1* | 5/2004 | Bottcher et al. | 324/754 |
| 2005/0048695 A1* | 3/2005 | Chia | H01L 23/3114 438/106 |
| 2006/0258135 A1* | 11/2006 | Sogawa et al. | 438/612 |
| 2008/0285244 A1* | 11/2008 | Knickerbocker | 361/760 |
| 2010/0308443 A1* | 12/2010 | Suthiwongsunthorn et al. | 257/621 |
| 2011/0074014 A1* | 3/2011 | Pagaila et al. | 257/737 |
| 2011/0248398 A1* | 10/2011 | Parvarandeh et al. | 257/737 |
| 2011/0316146 A1* | 12/2011 | Pagaila et al. | 257/737 |

* cited by examiner

INTERPOSERS OF 3-DIMENSIONAL INTEGRATED CIRCUIT PACKAGE SYSTEMS AND METHODS OF DESIGNING THE SAME

CROSS-REFERENCE TO RELATED APPLICATIONS

The present application claims priority of U.S. Provisional Patent Application Ser. No. 61/480,117, filed on Apr. 28, 2011, which is incorporated herein by reference in its entirety.

TECHNICAL FIELD

The present disclosure relates generally to the field of semiconductor package systems and, more particularly, to interposers of 3-dimensional integrated circuit (3D IC) package systems and methods of designing the same.

BACKGROUND OF THE DISCLOSURE

Since the invention of integrated circuits, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

Much higher device density has been achieved using 3D IC technology, and up to several layers of wafers have been bonded. As a result, the total wire length is significantly reduced. The number of vias is also reduced. Accordingly, 3D IC technology has the potential of being the mainstream technology of the next generation.

Methods for forming 3D IC include die-to-wafer bonding, wherein separate dies are bonded to a common wafer. An advantageous feature of the die-to-wafer bonding is that the size of the dies may be smaller than the size of chips on the wafer.

Recently, through-silicon-vias (TSVs), also referred to as through-wafer vias, are increasingly used as a way of implementing 3D IC. In one method a bottom wafer is bonded to a top wafer. Both wafers include integrated circuits over substrates. The integrated circuits in the bottom wafer are connected to the integrated circuits in the wafer through interconnect structures. The integrated circuits in the wafers are further connected to external pads through through-silicon-vias. The stacked wafers can be subjected to a sawing process to provide a plurality of stacked die structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
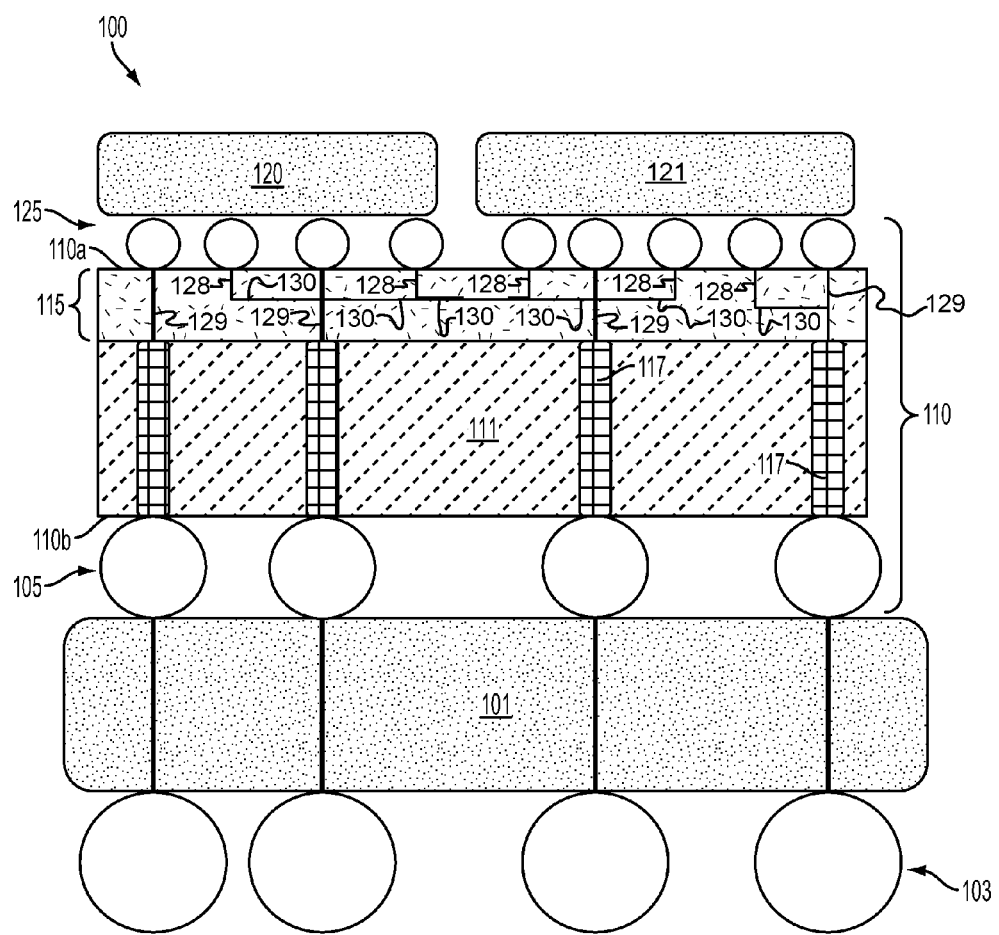
FIG. 1 is a schematic cross-sectional view of an exemplary 3-dimensional integrated circuit (3D IC) package system.

A package system has a silicon interposer disposed between silicon dies and a board substrate. The silicon interposer has a redistribution layer (RDL) for electrical connections between the silicon dies and a plurality of through-silicon-via (TSV) structures for an electrical connection between the silicon dies and the board substrate. The functionality of the silicon dies can be tested before assembly. However, the silicon dies are subjected to the risk that the interposer fails. If good silicon dies are bonded with a failed interposer, the whole package system is still failed and the good silicon dies are wasted and cannot be recovered. To the applicants' knowledge, the passive interposer does not include any circuits and/or devices for testing the RDL and the TSV structures.

Based on the foregoing, interposers with testing structures and methods of designing the interposers are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of a 3-dimensional integrated circuit (3D IC) exemplary package system. In FIG. 1, a 3-dimensional integrated circuit (3D IC) package system 100 includes a substrate 101. Pluralities of bumps 103 and 105 are disposed adjacent to surfaces (not labeled) of the substrate 101 that are opposite to each other. The bumps 103 and 105 are electrically coupled with each other by electrical connection structures (not labeled) on and/or through the substrate 101. In some embodiments, the bumps 103 can be configured to be disposed on another substrate or board (not shown). The dimension, e.g., diameter, of the bumps 103 is larger than that of the bumps 105.

Referring to FIG. 1, the package system 100 includes at least one interposer, e.g., an interposer 110 that is disposed over the substrate 101. The interposer 110 is configured to provide an electrical connection between the substrate 101 and dies 120 and 121 that are disposed over the interposer 110. The interposer 110 is electrically coupled with the substrate 101 through the bumps 105. The dies 120 and 121 can be electrically coupled with the interposer 110 through bumps 125.

The dimension, e.g., diameter, of the bumps 125 is smaller than that of the bumps 105. In some embodiments, the bumps 125 can be referred to as micro bumps, the bumps 105 can be referred to as Controlled Collapse Chip Connection (C4) bumps and the bumps 103 can be referred to as solder/package bumps. In other embodiments, the bumps 125 can have a diameter of about 15 μm or less. The bumps 105 can have a diameter of about 50 μm or less.

Referring again to FIG. 1, the interposer 110 includes a substrate 111 that is adjacent to a redistribution layer (RDL) 115. In some embodiments, the dies 120 and 121 are electrically coupled with each other through the RDL 115. As shown in FIG. 1, the bumps 105 and 125 are disposed adjacent to surfaces 110b and 110a of the interposer 110, respectively. The bumps 105 can be electrically coupled with the bumps 125 through vias 128-129 and electrical connection structures 130 in the RDL 115 and through-silicon-via (TSV) structures 117 in the substrate 111. In some embodiments, vias 128 are not coaxially aligned with TSV structures 117, whereas vias 129 are substantially coaxially aligned with corresponding TSV structures 117.

In some embodiments, the interposer 110 can include at least one passive device, e.g., a capacitor, a resistor, and/or an inductor. In other embodiments, the interposer 110 can be substantially free from including any active device, e.g., metal-oxide-semiconductor (MOS) transistors, bipolar junction transistors (BJTs), complementary MOS (CMOS) transistors, etc. In still other embodiments, the interposer 110 does not include any active device or passive device. The interposer 110 can be merely configured for providing an electrical connection. In yet still other embodiments, the interposer 110 can be referred to as a passive interposer.

In some embodiments, the substrate 111 may include an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial (epi) layer or a buried layer. In other examples, the compound semiconductor substrate may have a multilayer structure, or the substrate may include a multilayer compound semiconductor structure.

In some embodiments, the RDL 115 can include a plurality of electrical connection structures (not labeled), e.g., via plugs, contact plugs, dual damascene structures, damascene structures, metallic routing lines, other electrical connection structures, and/or any combinations thereof. In some embodiments, electrical connection structures of the RDL 115 can be made of at least one material, such as tungsten, aluminum, copper, titanium, tantalum, titanium nitride, tantalum nitride, nickel silicide, cobalt silicide, other proper conductive materials, and/or combinations thereof.

In some embodiments, the bumps 103, 105 and/or 125 can each be disposed on respective bonding pads (not shown). The bonding pads can be made of at least one material, such as copper (Cu), aluminum (Al), aluminum copper (AlCu), aluminum silicon copper (AlSiCu), or other conductive material or various combinations thereof. In some embodiments, the bonding pads may include an under bump metallization (UBM) layer. In some embodiments, the bumps 103, 105 and/or 125 can each be made of at least one material, such as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof.

Figure 2:
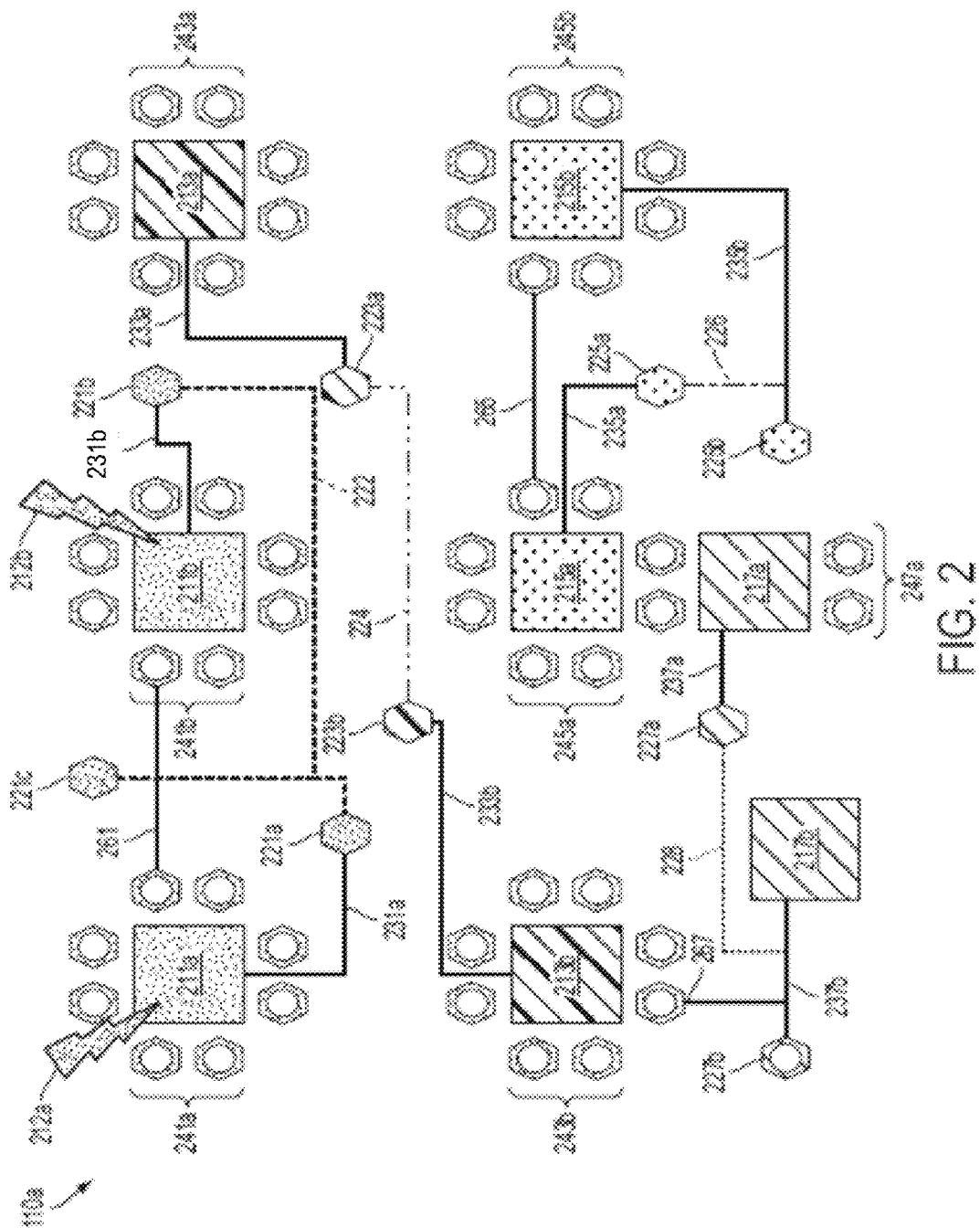
FIG. 2 is a top view on a portion of a surface of an exemplary interposer.

FIG. 2 is a top view on a portion of a surface of an exemplary interposer. In some embodiments, a plurality of probe pads, e.g., probe pads 211a-211b, 213a-213b, 215a-215b and 217a-217b can be disposed adjacent to the surface 110a of the interposer 110. The bumps 125 (shown in FIG. 1) can include a plurality of bumps, e.g., bumps 221a-221c, 223a-223b, 225a-225b and 227a-227b that are disposed adjacent to the surface 110a as shown in FIG. 2. The bumps 221a-221b, 223a-223b, 225a-225b and 227a-227b can be electrically coupled with the probe pads 211a-211b, 213a-213b, 215a-215b and 217a-217b through metallic lines 231a-231b, 233a-233b, 235a-235b and 237a-237b, respectively. The metallic lines 231a-231b, 233a-233b, 235a-235b and 237a-237b are disposed and configured for electrical testing between the probe pads 211a-211b, 213a-213b, 215a-215b and 217a-217b, respectively.

In some embodiments, the bumps 221a, 223a, 225a and 227a can be electrically coupled with the bumps 221b, 223b, 225b and 227b through metallic lines 222, 224, 226 and 228, respectively, of the RDL 115 of the interposer 110 shown in FIG. 1. The metallic lines 222, 224, 226 and 228 are portions of the electrical connection structures of the RDL 115 described above in conjunction with FIG. 1. In some embodiments, the metallic lines 222, 224, 226 and 228 are disposed and routed within the RDL 115 and represented with dotted lines as shown in FIG. 2.

Following are descriptions illustrating exemplary methods for testing electrical connection among the bumps 221a-221b, 223a-223b, 225a-225b and 227a-227b through the electrical connection structures of the RDL 115. As noted, the probe pads 211a-211b, 213a-213b, 215a-215b and 217a-217b are electrically coupled with the respective bumps 221a-221b, 223a-223b, 225a-225b and 227a-227b. Whether the electrical connection structures of the RDL 115 are short or open can be promptly tested by probing the probe pads. As being disposed in spaces where no bumps are disposed, the probe the probe pads 211a-211b, 213a-213b, 215a-215b and 217a-217b may not cost or increase additional areas for the interposer 110.

In some embodiments checking if the electrical connection between the bumps 221a and 221b is open, a probe pin 212a is applied to the probe pad 211a and another probe pin 212b is applied to the probe pad 211b. A voltage value of a logic state, e.g., a logic state "1", can be applied to the probe pad 211a through the probe pin 212a. If the same voltage value can be detected on the probe pad 211b, it is assumed that the bump 221a is electrically connected with the bump 221b and the electrical connection structure of the RDL 115 between the bumps 221a and 221b is accepted. If no voltage value is detected on the probe pad 211b, it is assumed that the electrical connection between the bumps 221a and 221b is open and the interposer 110 fails.

In other embodiments checking if the bump 221a is short to other bumps 223a-223b, 225a-225b and 227a-227b, the probe pin 212a is applied to the probe pad 211a and other probe pins (not shown) are applied to the probe pads 213a-213b, 215a-215b and 217a-217b. A voltage of a logic state, e.g., a logic state "1", can be applied to the probe pad 211a through the probe pin 212a. If no voltage value is detected on the probe pads 213a-213b, 215a-215b and 217a-217b, it is assumed that the bump 221a is not short to the bumps 223a-223b, 225a-225b and 227a-227b. If the same voltage value can be detected on at least one of the probe pads 213a-213b, 215a-215b and 217a-217b, it is assumed that the bump 221a is short to at least one of the bumps 223a-223b, 225a-225b and 227a-227b and the interposer 110 fails.

Following are descriptions regarding structures and methods for testing electrical connections between bumps 105 and 125 through the RDL 115 and the TSV structures 117 (shown in FIG. 1). In some embodiments, the bumps 125 can further include bumps 241a-241b, 243a-243b, 245a-245b and 247a that are disposed adjacent to the surface 110a of the interposer 110 as shown in FIG. 2. The bumps 241a-241b, 243a-243b, 245a-245b and 247a can be disposed adjacent to probe pads 211a-211b, 213a-213b, 215a-215b and 217a, respectively. In some embodiments, the bumps 241a-241b, 243a-243b and 245a-245b can be disposed around the respective probe pads 211a-211b, 213a-213b and 215a-215b. In other embodiments, the bumps 247a are adjacent to the probe pad 217a. In still other embodiments, the single probe pad 247b is disposed on the surface 110a. In some embodiments, the bumps 241a-241b, 243a-243b, 245a-245b and 247a are electrically isolated from the probe pads 211a-211b, 213a-213b, 215a-215b and 217a, respectively.

In some embodiments, the bumps 241a, 245a and 243b can be electrically coupled with the bumps 241b, 245b and 227b through metallic lines 261, 265 and 267, respectively. In some embodiments, the metallic lines 261, 265 and 267 disposed on the surface 110a and represented with solid lines. The metallic lines 261 can be made of at least one material, such as tungsten, aluminum, copper, titanium, tantalum, titanium nitride, tantalum nitride, nickel silicide, cobalt silicide, other proper conductive materials, and/or combinations thereof.

Figure 3A:
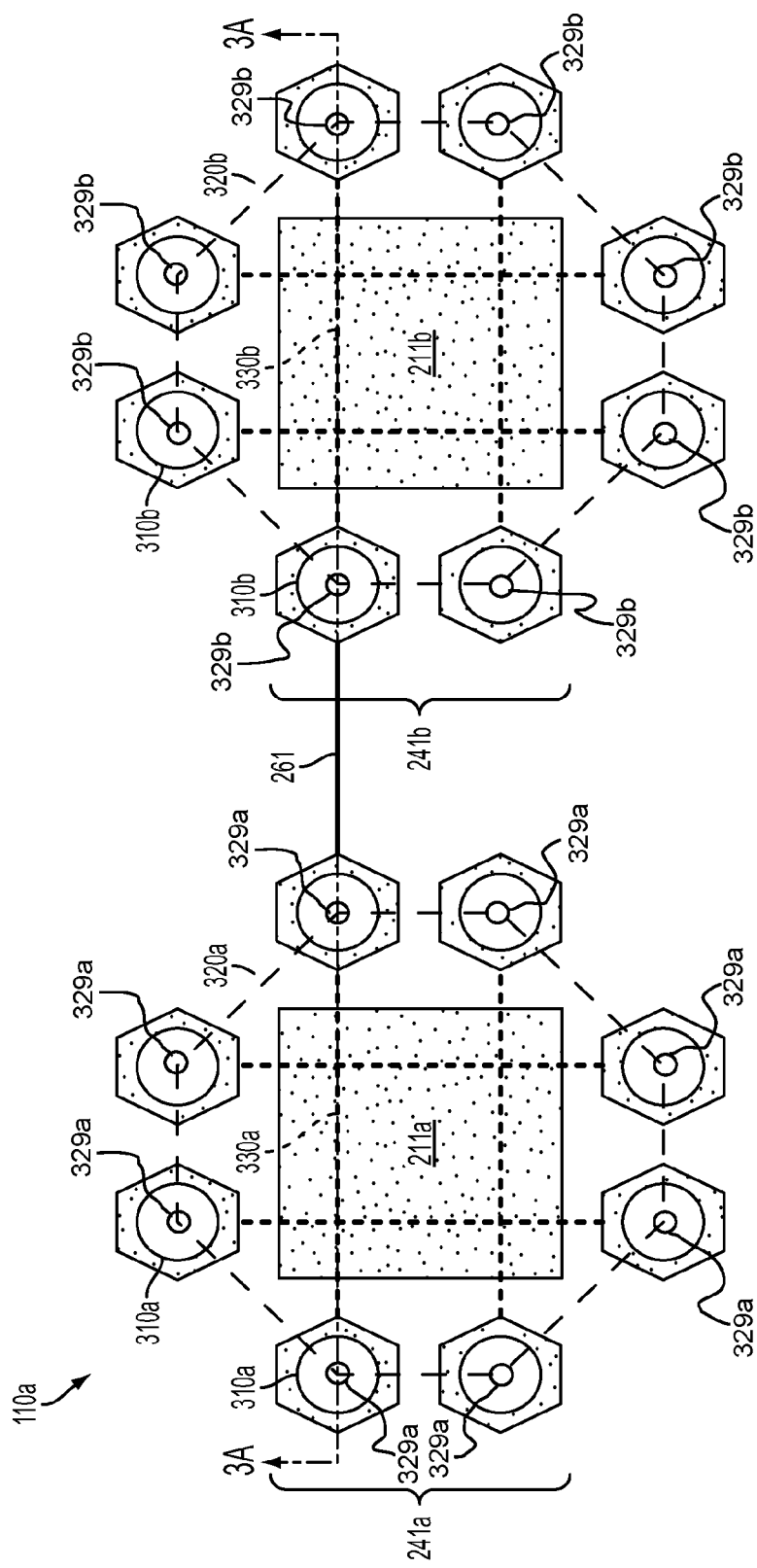
FIG. 3A is a magnified top view of a portion of an exemplary interposer.
Figure 3B:
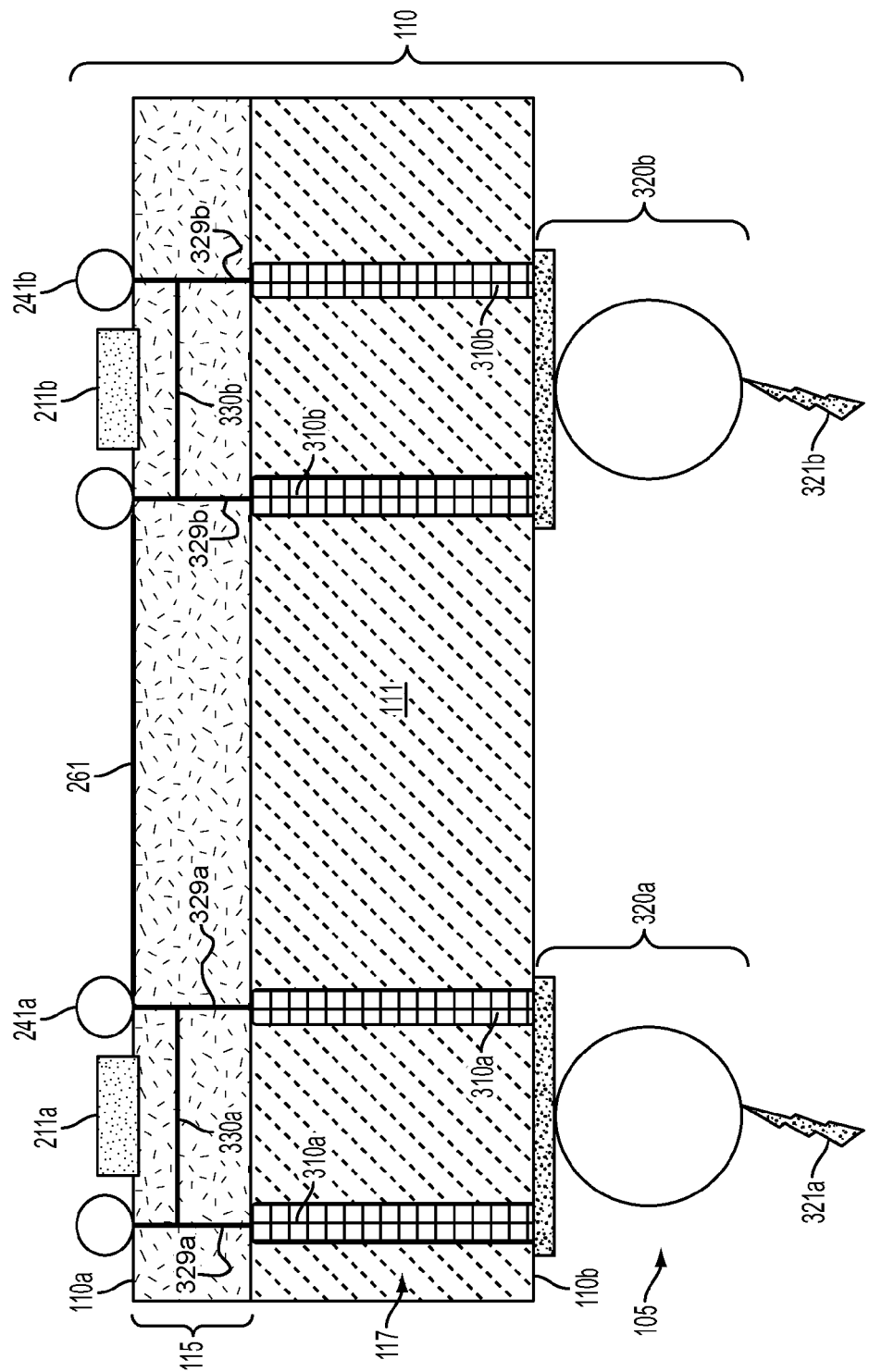
FIG. 3B is a sectional view of the portion of the exemplary interposer taken along the section line 3B-3B of FIG. 3A.

FIG. 3A is a magnified top view of a portion of an exemplary interposer. FIG. 3B is a sectional view of the portion of the exemplary interposer taken along the section line 3B-3B of FIG. 3A. In FIG. 3A, the bumps 241a-241b are disposed around the probe pads 211a-211b, respectively. The bumps 241a are electrically coupled with the bumps 241b through the metallic line 261. In some embodiments, the metallic line 261 is disposed on the surface 110a of the interposer 110.

In some embodiments, the bumps 241a are electrically coupled with each other through an electrical connection structure 330a of the RDL 115 (shown in FIG. 1). The bumps 241b are electrically coupled with each other through another electrical connection structure 330b of the RDL 115. In other embodiments, the electrical connection structures 330a and 330b are disposed below the surface 110a of the interposer 110 and are represented with dotted lines.

Referring to FIGS. 3A-3B, the vias 129 can include vias 329a-329b that are disposed within the RDL 115 of the interposer 110 and that are electrically coupled with corresponding bumps 241a-241b. The TSV structures 117 can include TSV structures 310a-310b that are disposed within the substrate 111 of the interposer 110 and electrically coupled with corresponding bumps 241a-241b though the corresponding vias 329a-329b. In some embodiments, the vias 329a are electrically coupled together through an electrical connection structure 330a, and the vias 329b are electrically coupled together through an electrical connection structure 330b. In some embodiments, vias 329a are substantially coaxially aligned with TSV structures 310a, and vias 329b are substantially coaxially aligned with corresponding TSV structures 310b. The TSV structures 310a-310b and the bumps 241a-241b are configured to transmit the same power/signal transmission. In some embodiments, the TSV structures 310a each can at least partially overlap with the respective bumps 241a in the direction that is orthogonal to the surface 110a of the interposer 110. In other embodiments, the TSV structures 310a-310b each can be disposed directly under the respective bumps 241a-241b as shown in FIG. 3A.

Referring to FIG. 3B, in some embodiments, the bumps 105 can include bumps 320a and 320b that are disposed adjacent to the surface 110b of the interposer 110. Because the bumps 320a and 320b are disposed adjacent to the surface 110b that is opposite to the surface 110a, the bumps 320a and 320b are represented with dotted lines in FIG. 3A, which illustrates the top view of the surface 110a. In some embodiments, the bumps 320a and 320b can be electrically coupled with the TSV structures 310a and 310b, respectively, through a RDL (not labeled) that is disposed adjacent to the surface 110b. The bumps 320a-320b can be electrically coupled with the bumps 241a-241b through the TSV structures 310a-310b and the electrical connection structures 330a-330b, respectively.

As noted, the bumps 241a are electrically coupled with the bumps 241b through the metallic line 261 as shown in FIG. 3B. In some embodiments checking if the electrical connection through the TSV structures 310a-310b is open, a probe pin 321a is applied to the bump 320a and another probe pin 321b is applied to the bump 320b. A voltage of a logic state, e.g., a logic state "1", can be applied to the bump 320a. If the same voltage value can be detected on the bump 320b, it is assumed that the bump 320a is electrically coupled with the bump 320b and the TSV structures 310a-310b are accepted. If no voltage value is detected on the bump 320b, it is assumed that the electrical connection between the bumps 320a and 320b through the TSV structures 310a-310b is open and the interposer 110 fails.

In some embodiments checking if the TSV structures 310a are short to other TSV structures e.g., TSV structures under the bumps 243a-243b and 245a-245b (shown in FIG. 2) that are not intended to be electrically connected, the probe pin 321a is applied to the bump 320a and other probe pins (not shown) are applied to the bumps that are electrically coupled with other unintended TSV structures. A voltage of a logic state, e.g., a logic state "1", can be applied to the bump 320a. If no voltage value is detected on the bumps that are electrically coupled with other unintended TSV structures, it is assumed that the TSV structures 310a are not short to the other unintended TSV structures and the TSV structures 310a are accepted. If the same voltage value can be detected on at least one of the bumps that are electrically coupled with the unintended TSV structures, it is assumed that the TSV structures 310a are short to at least one of the unintended TSV structures and the interposer 110 fails.

Referring again to FIGS. 2 and 3A, in some embodiments the bumps 241a can be arranged in an octangular fashion and around the probe pad 211a. The bumps 241a each can be electrically coupled with the respective TSV structures 310a that are disposed directly thereunder. With the number of the TSV structures 310a, the bump 320a, the TSV structures 310a and the bumps 241a can be configured for power and/or signal transmissions. It is noted that the numbers and/or arrangement of the bumps 241a and TSV structures 310a described above in conjunction with FIG. 3A are merely exemplary. The scope of this application is not limited thereto. The numbers and/or arrangement of the bumps and TSV structures can be modified. For example, the bumps 241a and/or the TSV structures 310a can be arranged in a triangle fashion, a square fashion, a rectangular fashion, a pentagonal fashion, a hexagonal fashion, and/or other arrangements. In other embodiments, not all of the TSV structures 310a are disposed directly under the bumps 241a. In still other embodiments, the TSV structures 310a are completely misaligned from the bumps 241a in the direction that is orthogonal to the surface 110a.

Figure 4A:
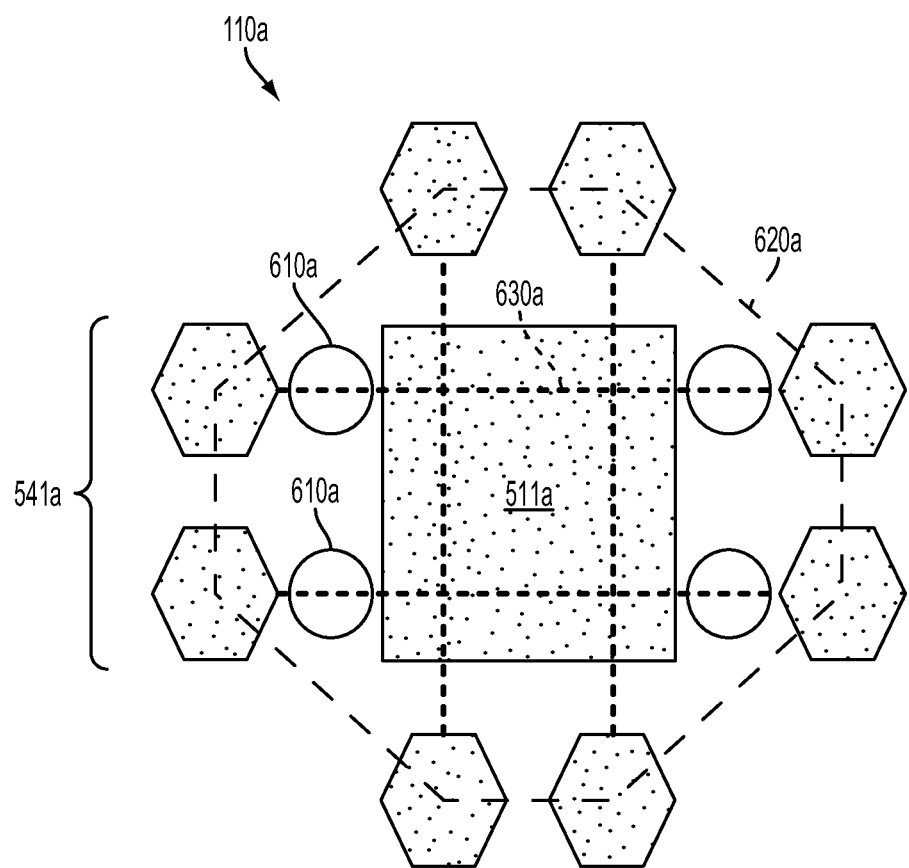
FIGS. 4A-4G and 5A-5E show various portions of a top view of an exemplary interposer.

For example, FIG. 4A shows a portion of a top view of an exemplary interposer. Items of FIG. 4A that are the same or similar items in FIG. 3A are indicated by the same reference numerals, increased by 300. In FIG. 4A, bumps 541a and a probe pad 511a are disposed on the surface 110a of the interposer 110. The bumps 541a are disposed around the probe pad 511a. The bumps 541a can be electrically coupled with each other through an electrical connection structure 630a. A bump 620a is disposed on the surface 110b of the interposer 110 that is opposite to the surface 110a.

In some embodiments, the interposer 110 includes at least one TSV structure, e.g., TSV structures 610a. The TSV structures 610a can be partially and/or completely misaligned from the bumps 541a in a direction that is orthogonal to the surface 110a of the interposer 110. In some embodiments, the bump 620a is electrically coupled with the bumps 541a through the TSV structures 610a and the electrical connection structure 630a. With the numbers of the TSV structures 610a and/or the bumps 541a, the bump 620a, the TSV structures 610a and the bumps 541a can be configured for power and/or signal transmissions. It is noted that the numbers and/or arrangement of the bumps and TSV structures described above in conjunction with FIG. 4A are merely exemplary. The numbers and/or arrangement of the bumps and TSV structures can be modified.

Figure 4B:
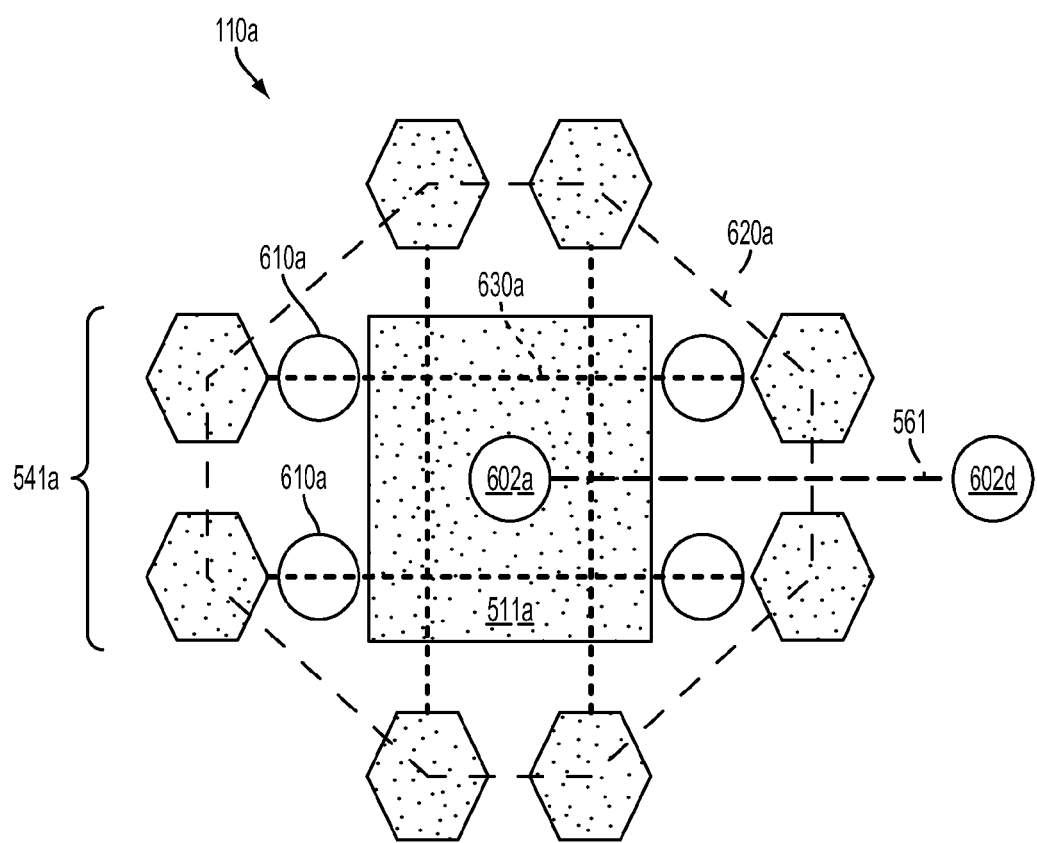

FIG. 4B shows a top view of another exemplary portion of an exemplary interposer. In FIG. 4B, at least one TSV structure, e.g., a TSV structure 602a, can be disposed directly under the probe pad 511a. The TSV structure 602a is electrically isolated from the TSV structures 610a. The TSV structure 602d can be electrically coupled with an island TSV structure 602b through a metallic line 561. The island TSV structure 602d can be electrically coupled with another bump (not shown) that is disposed adjacent to the surface 110b.

In at least this embodiment, the TSV structure 602a is provided solely for the TSV electrical connection test. The TSV structures 602a and 602d are not configured to provide power and/or signal transmissions through the interposer 110. In the situation that the electrical connection through the TSV structures 602a and 602d is accepted, it is assumed that the electrical connection through the TSV structures 610a is more likely to be accepted. In some embodiments, the TSV structures 602a and 602d can be referred to as dummy TSV structures. Here, the term "dummy TSV structure" means that the TSV structure is provided for the electrical connection test, not for power/signal transmission.

Figure 4C:
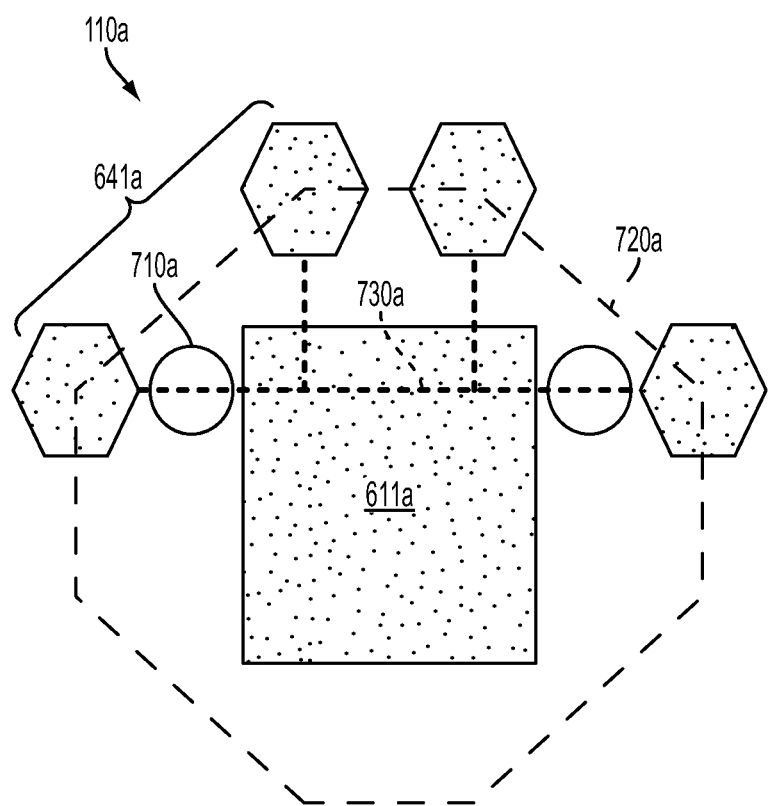

As noted, the numbers of the bumps 541a and/or TSV structures 610a, 602a can be modified. For example, FIG. 4C shows a top view of the other exemplary portion of an exemplary interposer. Items of FIG. 4C that are the same or similar items in FIG. 4A are indicated by the same reference numerals, increased by 100. In FIG. 4C, bumps 641a and a probe pad 611a are disposed on the surface 110a of the interposer 110. The bumps 641a are disposed adjacent to the probe pad 611a. The bumps 641a can be electrically coupled with each other through an electrical connection structure 730a. A bump 720a is disposed on the surface 110b of the interposer 110 that is opposite to the surface 110a. The bump 720a is electrically coupled with the bumps 641a through TSV structures 710a and the electrical connection structure 730a.

As shown in FIG. 4C, the interposer 110 includes four bumps 641a and two TSV structures 710a. With fewer TSV structures 710a and bumps 641a, the bump 720a, the TSV structures 710a and the bumps 641a can be configured for a signal transmission. In other embodiments, more or less than two TSV structures 710a can be used for the signal transmission. In still other embodiments, more or less than four bumps 641a can be used for the signal transmission.

Referring again to FIG. 4C, the bumps 641a and the TSV structures 710a are disposed and configured close to one side of the probe pad 611a. This configuration is merely exemplary and the scope of this application is not limited thereto. In some embodiments, the bumps 641a and/or the TSV structures 710a can be randomly deployed and/or around the probe pad 511a as long as the TSV structures 710a can be electrically coupled with the bumps 641a through the electrical connection structure 730a. In some embodiments, the TSV structure 602a described above in conjunction with FIG. 4B can be disposed directly under the probe pad 611a.

Figure 4D:
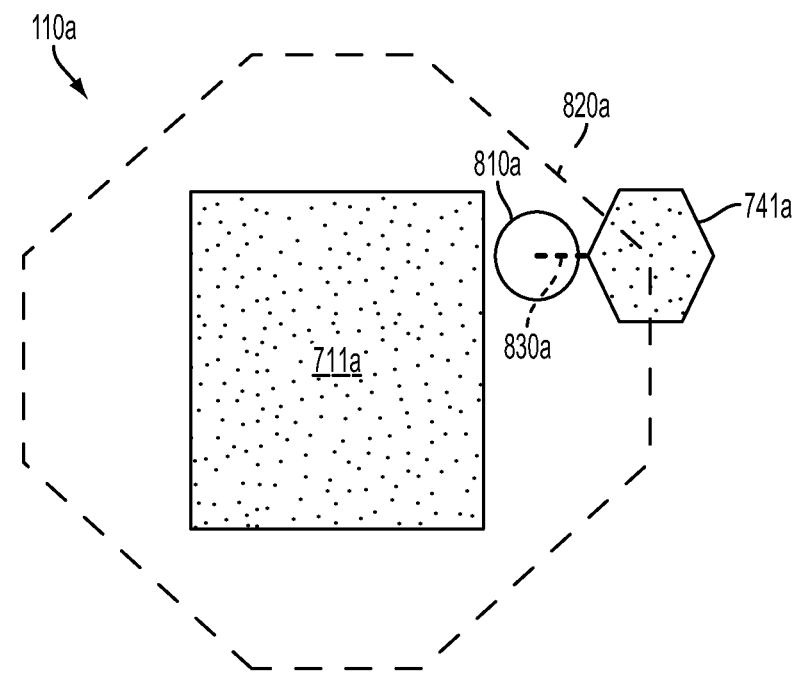

FIG. 4D shows a top view of an exemplary portion of an exemplary interposer. Items of FIG. 4D that are the same or similar items in FIG. 4A are indicated by the same reference numerals, increased by 200. In FIG. 4D, a bump 741a and a probe pad 711a are disposed on the surface 110a of the interposer 110. The bump 741a is disposed adjacent to the probe pad 711a. A bump 820a is disposed on the surface 110b of the interposer 110 that is opposite to the surface 110a. The bump 820a is electrically coupled with the bump 741a through a TSV structure 810a and the electrical connection structure 830a.

As shown in FIG. 4D, the interposer 110 includes a single bump 741a and a single TSV structure 810a. With the single TSV structure 810a and the bump 741a, the bump 820a, the TSV structures 810a and the bumps 741a can be configured for a signal transmission. In some embodiments, the TSV structure 602a described above in conjunction with FIG. 4B can be disposed directly under the probe pad 711a.

Figure 4E:
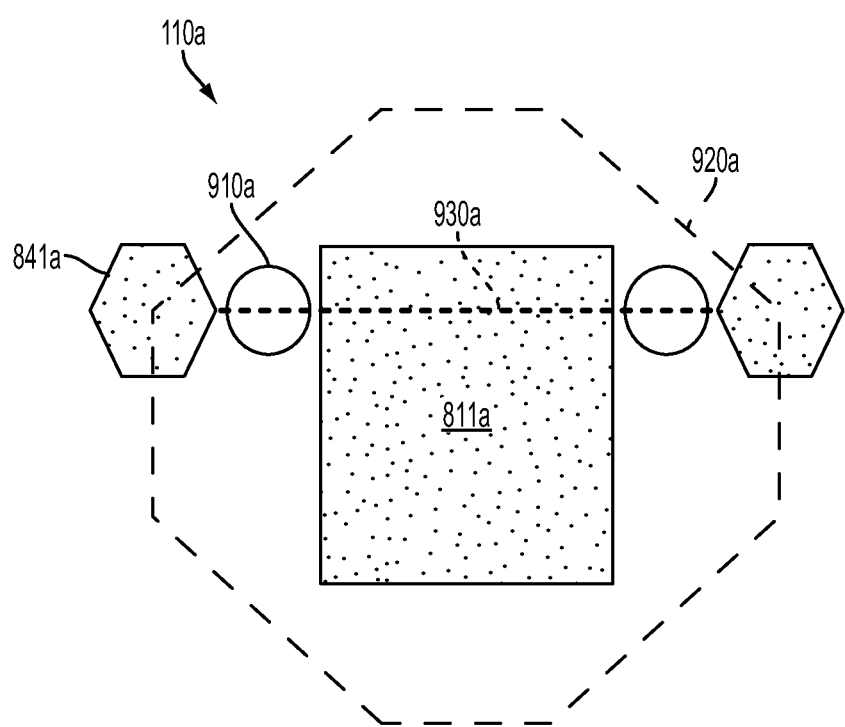

FIG. 4E shows a top view of an exemplary portion of an exemplary interposer. Items of FIG. 4E that are the same or similar items in FIG. 4A are indicated by the same reference numerals, increased by 300. In FIG. 4E, bumps 841a and a probe pad 811a are disposed on the surface 110a of the interposer 110. The bumps 841a each are disposed adjacent to the respective corners of the probe pad 811a. A bump 920a is disposed on the surface 110b of the interposer 110 that is opposite to the surface 110a. The bump 920a is electrically coupled with the bumps 841a through the TSV structures 910a and the electrical connection structure 930a.

Figure 4F:
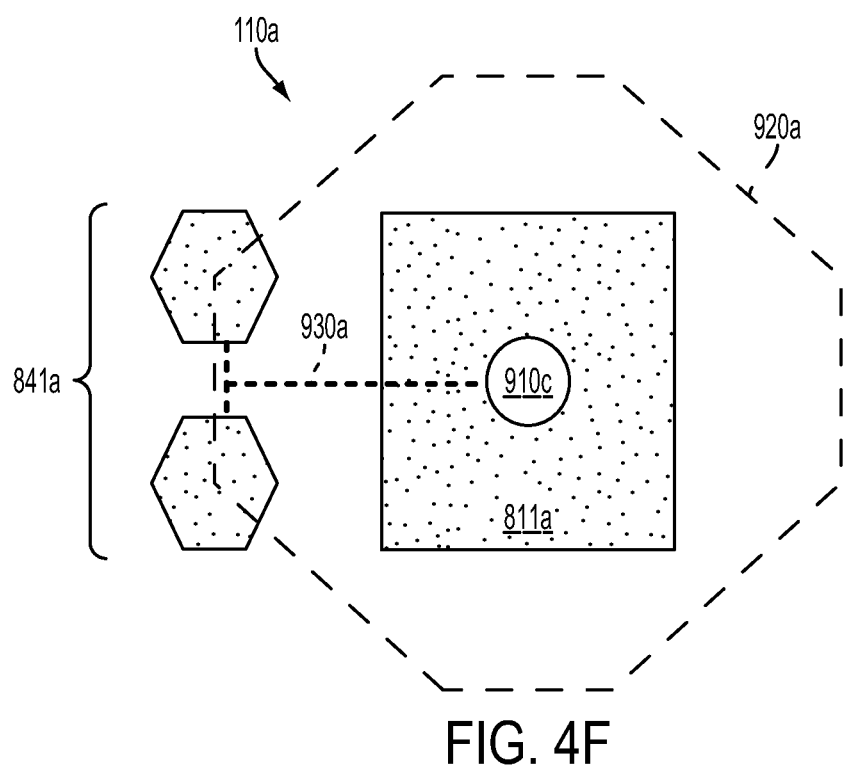

In some embodiments, no TSV structure is disposed between the probe pad and the bumps. For example, FIG. 4F shows a top view of an exemplary portion of an exemplary interposer. Items of FIG. 4F that are the same or similar items in FIG. 4B are indicated by the same reference numerals, increased by 300. The bump 920a is electrically coupled with the bump 841a through a TSV structure 910c and the electrical connection structure 930a.

As shown in FIG. 4F, the TSV structure 910c is disposed directly under the probe pad 811a. No TSV structures are disposed between the bumps 841a and the probe pad 811a. With the single TSV structure 910c, the bump 920a, the TSV structure 910c and the bumps 841a can be configured for a signal transmission. Though the bumps 841a are disposed adjacent to one side of the probe pad 811a, the scope of this application is not limited thereto. In other embodiments, the bumps 841a can be disposed separately from each other.

Figure 4G:
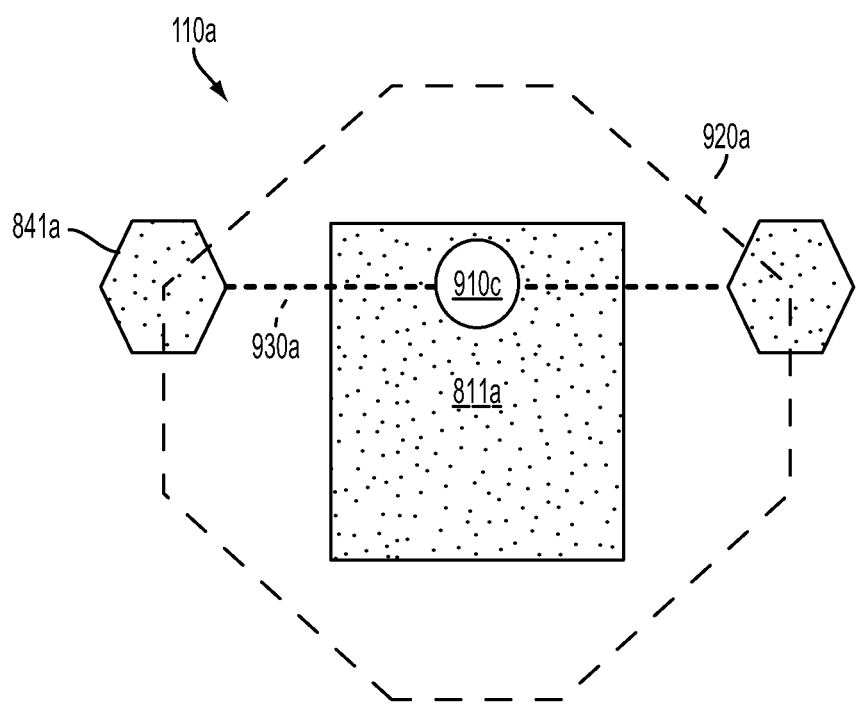

As noted, the bumps 841a can be randomly deployed and/or around the probe pad 811a as long as the TSV structures 910c can be electrically coupled with the bumps 841a through the electrical connection structure 930a. For example, the bumps 841a can each be disposed adjacent to the opposite side of the probe pad 811a as shown in FIG. 4G. In other embodiments, the TSV structure 910c can be disposed adjacent to the edge of the probe pad 811a and distant from the center of the probe pad 811a.

Figure 5A:
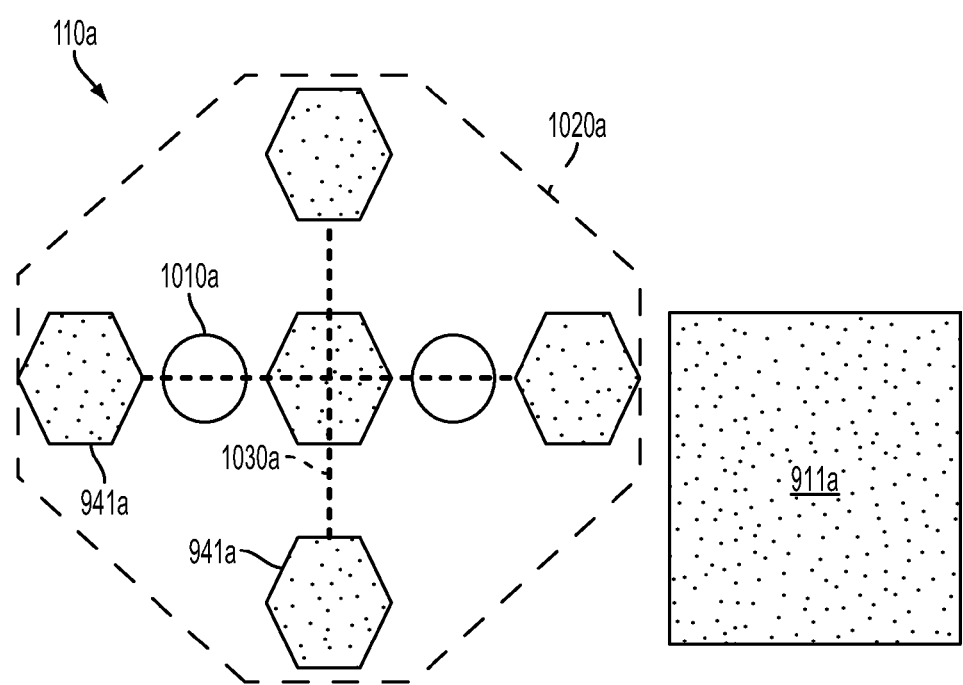

In some embodiments, the probe pad disposed adjacent to a first surface of the interposer and the bump that is disposed adjacent to a second surface of the interposer are misaligned from each other along a direction that is orthogonal to the first surface. For example, FIG. 5A shows a top view of an exemplary portion of an exemplary interposer. Items of FIG. 5A that are the same or similar items in FIG. 4A are indicated by the same reference numerals, increased by 400. In FIG. 5A, bumps 941a and a probe pad 911a are disposed on the surface 110a of the interposer 110. The bumps 941a are disposed adjacent to the probe pad 911a. A bump 1020a is disposed on another surface of the interposer 110 that is opposite to the surface 110a. The bump 1020a is electrically coupled with the bumps 941a through TSV structures 1010a and the electrical connection structure 1030a. With the number of the TSV structures 1010a and the bumps 941a, the bump 1020a, the TSV structures 1010a and the bumps 941a can be configured for power and/or signal transmissions.

As shown in FIG. 5A, the probe pad 911a is misaligned from the bump 1020a in the direction that is orthogonal to the surface 110a. It is noted that the numbers and/or arrangement of the bumps and TSV structures described above in conjunction with FIG. 5A are merely exemplary. The numbers and/or arrangement of the bumps and TSV structures can be modified.

Figure 5B:
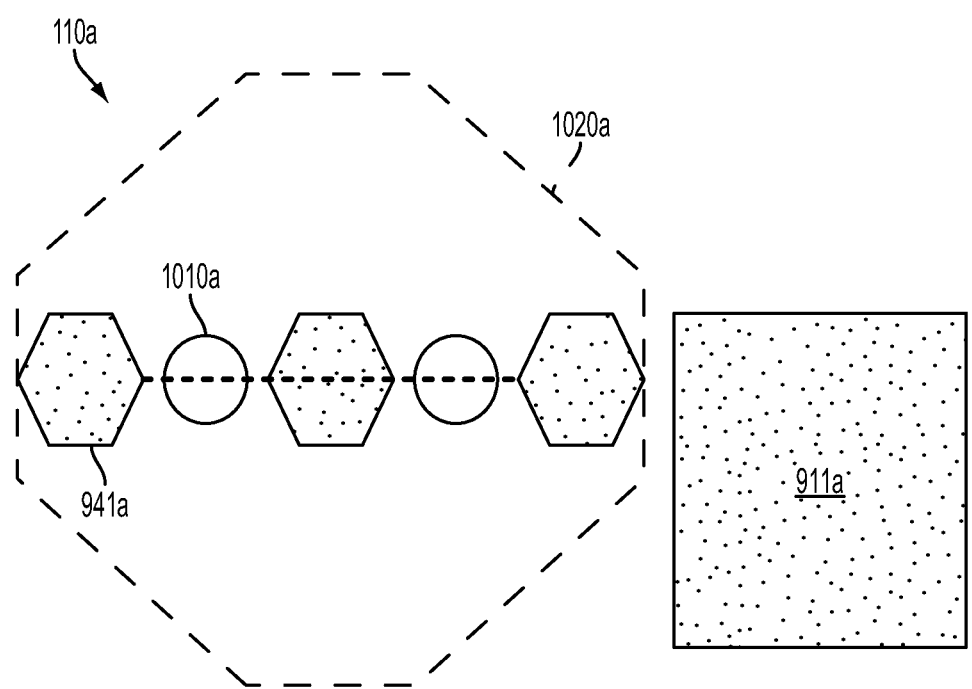

For example, few bumps 941a can be disposed adjacent to the probe pad 911a as shown in FIG. 5B. As the number of bumps 941a is reduced, the bump 1020a, the TSV structures 1010a and the bumps 941a shown in FIG. 5B can be configured for a signal transmissions.

Figure 5C:
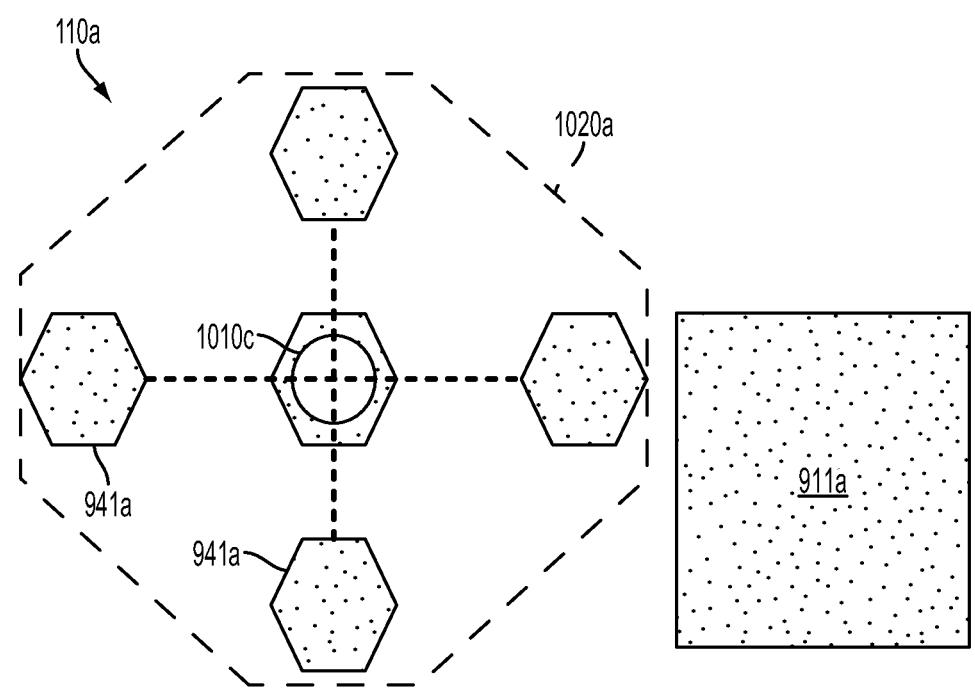

In other embodiments, a single TSV structure 1010c can be disposed directly under a bump 941a as shown in FIG. 5C. As the use of a single TSV structure 1010c, the bump 1020a, the TSV structure 1010c and the bumps 941a shown in FIG. 5C can be configured for a signal transmissions.

Figure 5D:
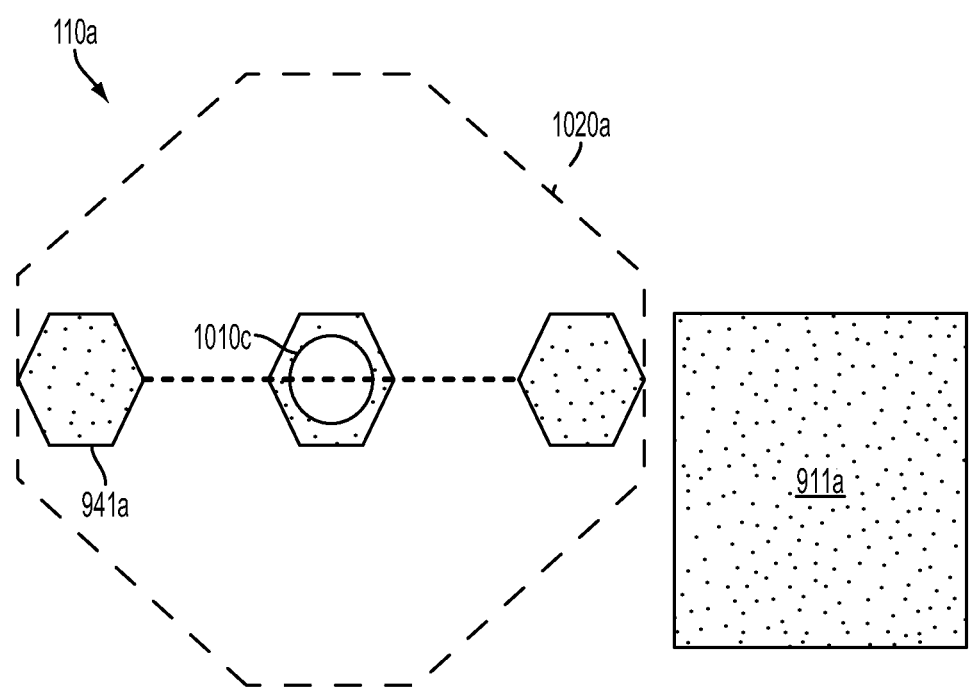

In still other embodiments, few bumps 941a can be disposed adjacent to the probe pad 911a as shown in FIG. 5D. As both the numbers of bumps 941a and the TSV structure 1010c are reduced, the bump 1020a, the TSV structure 1010c and the bumps 941a shown in FIG. 5D can be configured for a signal transmissions.

Figure 5E:
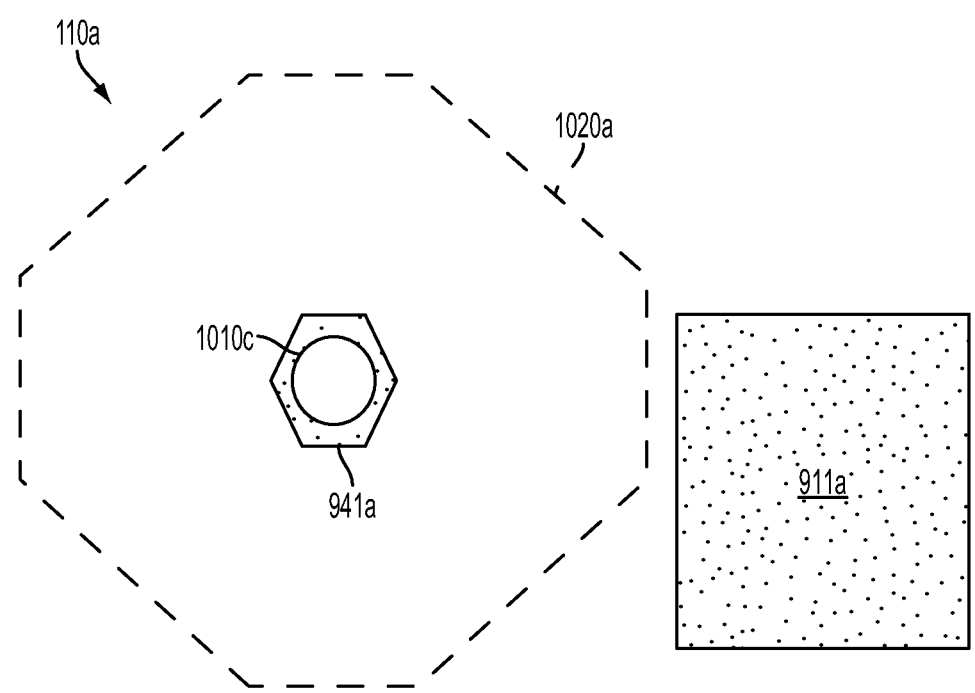

In yet other embodiments, a single TSV structure 941a is disposed over the surface 110a and electrically coupled with the bump 1020a through the single TSV structure 1010c for a signal transmission as shown in FIG. 5E.

Figure 6:
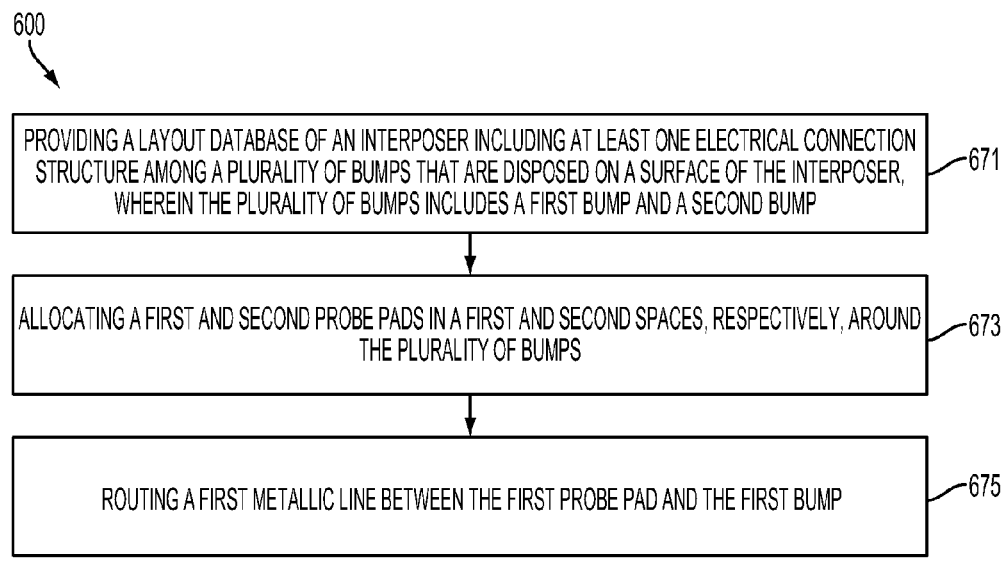
FIG. 6 is a flowchart illustrating an exemplary method of designing an interposer of a 3-dimensional integrated circuit (3D IC) package system.

Following are description associated with exemplary methods of designing an interposer. FIG. 6 is a flowchart illustrating an exemplary method of designing an interposer of a 3D IC package system. In FIG. 6, a method 600 of designing an interposer includes providing a layout database of an interposer including at least one electrical connection structure among a plurality of bumps that are disposed on a surface of the interposer, wherein the plurality of bumps includes a first bump and a second bump (block 671). The method 600 includes allocating a first and second probe pads in a first and second spaces around the plurality of bumps (block 673). The method 600 further includes routing a first metallic line between the first probe pad and the first bump (block 675).

For example, the block 671 can include providing a layout database of the interposer 110 (shown in FIG. 2). The layout database of the interposer 110 includes the routing of the electrical connection structures of the RDL 115 and locations of the bumps 221a-221c, 223a-223b, 225a-225b, 227a-227b, 241a-241b, 243a-243b, 245a-245b and 247a.

In some embodiments, the block 673 includes allocating a first and second probe pads in a first and second spaces, respectively, around the plurality of bumps. For example, the probe pads 211a-211b, 213a-213b, 215a-215b and 217a-217b can be allocated in spaces around the bumps 221a-221c, 223a-223b, 225a-225b, 227a-227b, 241a-241b, 243a-243b, 245a-245b and 247a. For example, the probe pads 211a-211b, 213a-213b and 215a-215b can be allocated in spaces that are surrounded by the bumps 221a-221c, 223a-223b, 225a-225b, 227a-227b, 241a-241b, 243a-243b and 245a-245b, respectively. In other embodiments, the pad 217a can be allocated at the space that is adjacent to the bumps 247a. In still other embodiments, the pad 217b can be solely allocated and distant from the bumps.

In some embodiments, the block 675 includes routing a first metallic line between the first probe pad and the first bump. For example, the metallic lines 231a-231b, 233a-233b, 235a-235b and 237a-237b can be routed between the probe pads 211a-211b, 213a-213b, 215a-215b, 217a-217b and the bumps 221a-221b, 223a-223b, 225a-225b, 227a-227b, respectively.

In some embodiments, the method 600 can optionally include comparing distances of the first bump to the first and second probe pads, and determining if the distance between the first probe pad and the first bump is shorter than the distance between the second probe pad and the first bump, wherein if the distance between the first probe pad and the first bump is shorter than the distance between the second probe pad and the first bump, and the first metallic line is routed between the first probe pad and the first bump. For example, routing the metallic line 231a between the probe pad 211a and the bump 221a can include comparing distances of the bump 211a to the probe pad 211a and 211b. As shown in FIG. 2, the distance between the bump 221a and the probe pad 211a is shorter than the distance between the bump 211a and the probe pad 211b. The method 600 then routes the metallic line 231a between the probe pad 211a and the bump 221a.

In some embodiments, the method 600 can optionally include allocating the second probe pad in the second space that are surrounded by at least one fourth bump of the plurality of bumps that are disposed on the surface of the interposer, and routing a second metallic line between the second probe pad and the second bump. For example, the probe pad 211b can be allocated in the space that is surrounded by the bumps 241b. The metallic line 231b is routed between the probe pad 211b and the bump 221b.

In some embodiments, the method 600 can optionally route a third metallic line between the at least one third bump and the at least one fourth bump. For example, the metallic line 261 can be routed between the bumps 241a and 241b.

In a first embodiment of this application, an interposer of a package system includes a first probe pad disposed adjacent to a first surface of the interposer. A second probe pad is disposed adjacent to the first surface of the interposer. A first bump of a first dimension is disposed adjacent to the first surface of the interposer. The first bump is electrically coupled with the first probe pad. A second bump of the first dimension is disposed adjacent to the first surface of the interposer. The second bump is electrically coupled with the second probe pad. The second bump is electrically coupled with the first bump through a redistribution layer (RDL) of the interposer.

In a second embodiment of this application, a method of designing an interposer of a package system includes providing a layout database of an interposer including at least one electrical connection structure among a plurality of bumps that are disposed on a surface of the interposer, wherein the plurality of bumps includes a first bump and a second bump. A first and second probe pads are allocated in a first and second spaces, respectively, around the plurality of bumps. A first metallic line is routed between the first probe pad and the first bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interposer for a 3-dimensional integrated circuit (3D IC) package system, the interposer comprising:
   a substrate;
   a redistribution layer on the substrate;
      the redistribution layer having a first surface opposite the substrate and a plurality of electrical paths; and
      the substrate having a second surface opposite the redistribution layer;
   a first probe pad on the first surface;
   a second probe pad on the first surface;
   at least one first bump having a first dimension and being on the first surface, the at least one first bump being separated from the first probe pad in a first direction parallel to the first surface;
   a first electrical connection, on the first surface, electrically coupling the at least one first bump with the first probe pad;
   at least one second bump having the first dimension and being on the first surface, the at least one second bump being separated from the second probe pad in a second direction parallel to the first surface;
   a second electrical connection, on the first surface, electrically coupling the at least one second bump with the second probe pad;
   a third electrical connection which is substantially encapsulated by the redistribution layer, electrically coupling the at least one first bump with the at least one second bump;
   wherein the first probe pad is electrically coupled with the second probe pad through the first electrical connection, the at least one first bump, the third electrical connection, the second bump and the second electrical connection;
   third bumps having the first dimension adjacent to the first probe pad, the third bumps being electrically isolated from the first probe pad;
   first vias within the redistribution layer, the first vias being electrically coupled with corresponding ones of the third bumps; and
   first through-silicon-via (TSV) structures within the interposer, the first TSV structures being electrically coupled with corresponding ones of the first vias; and
   wherein the third bumps are electrically coupled with corresponding ones of the TSV structures through corresponding ones of the first vias; and
   wherein at least one of the first TSV structures and a corresponding at least one of the first vias are substantially coaxially aligned in a third direction which is orthogonal to the first surface.

2. The interposer of claim 1, further comprising:
   third bumps and fourth bumps having the first dimension and correspondingly adjacent to the first probe pad and the second probe pad, wherein the third bumps and the fourth bumps are correspondingly electrically isolated from the first probe pad and the second probe pad.

3. The interposer of claim 2, further comprising:
   second vias within the redistribution layer, the second vias being electrically coupled with corresponding ones of the fourth bumps; and
   second through-silicon-via (TSV) structures within the interposer, the second TSV structures being electrically coupled with corresponding ones of the fourth bumps;

wherein the fourth bumps are electrically coupled with corresponding ones of the second TSV structures through corresponding ones of the second vias; and wherein at least one of the second TSV structures and a corresponding at least one of the second vias are substantially coaxially aligned in the third direction.

4. The interposer of claim 1, wherein a first distance between the first probe pad and a given one of the at least one first bump is shorter than a second distance between the second probe pad and the given one of the at least one first bump.

5. The interposer of claim 4, wherein:
a third distance between the second probe pad and the second bump is shorter than a fourth distance between the first probe pad and the second bump.

6. The interposer of claim 5, wherein:
the second probe pad is surrounded by and electrically isolated from fourth bumps having the second dimension; and
a fifth distance between the second probe pad and the second bump is greater than a sixth distance between the second probe pad and a given one of the fourth bumps.

7. The interposer of claim 3, wherein:
a corresponding at least one of the fourth bumps is substantially coaxially aligned with the substantially coaxially aligned corresponding at least one of the second TSV structures and the at least one of the second vias.

8. The interposer of claim 2, wherein:
a corresponding at least one of the third bumps is substantially coaxially aligned with the substantially coaxially aligned corresponding at least one of the first TSV structures and the at least one of the first vias.

9. The interposer of claim 2, further comprising:
a fourth electrical connection electrically coupling together the first probe pad and the second probe pad;
wherein at least one of the first TSV structures is electrically coupled to a corresponding at least one of the second TSV structures through a corresponding at least one of the first vias, the fourth electrical connection and a corresponding at least one of the second vias.

10. An interposer for a 3-dimensional integrated circuit (3D IC) package system, the interposer comprising:
a substrate;
a redistribution layer on the substrate;
the redistribution layer having a first surface opposite the substrate and a plurality of electrical paths and the substrate having a second surface opposite the redistribution layer;
first bumps having a first dimension on the first surface;
first vias within the redistribution layer, the first vias being electrically coupled with corresponding ones of the first bumps;
at least one first electrical connection electrically coupling together the first vias;
first through-silicon-via (TSV) structures within the interposer, the at least one first TSV structures being electrically coupled to corresponding ones of the first vias;
wherein the first bumps are electrically coupled to corresponding ones of the first TSV structures through corresponding ones of the first vias;
second bumps having the first dimension on the first surface;
second vias within the redistribution layer, the second vias being electrically coupled to corresponding ones of the second bumps;

at least one a second electrical connection electrically coupling together the second vias;
second TSV structures within the interposer, the second TSV structures being electrically coupled corresponding ones of the second vias;
wherein the second bumps are electrically coupled to corresponding ones of the second TSV structures through corresponding ones of the second vias; and
a third electrical connection, on the first surface, electrically coupling together at least one of the first bumps and at least one of the second bumps; and
wherein at least one of the first TSV structures is electrically coupled to a corresponding at least one of the second TSV structures through a corresponding at least one of the first vias, the third electrical connection and a corresponding at least one of the second vias; and
wherein the interposer exhibits at least one triplet,
components of a given triplet of the at least one triplet including one of the first bumps and a corresponding one of the first vias and a corresponding one of the first TSV structures; and
all components of each triplet of the at least one triplet are substantially coaxially aligned in a direction which is orthogonal to the first surface.

11. The interposer of claim 10, further comprising:
a fourth bump having the first dimension disposed on the first surface, the fourth bump being electrically coupled with a first probe pad; and
a fifth bump having the first dimension disposed on the first surface, the fifth bump being electrically coupled with a second probe pad, the fifth bump also being electrically coupled with the fourth bump.

12. The interposer of claim 10, wherein the third electrical connection is a metallic line.

13. The interposer of claim 11, wherein:
the fourth bump is electrically coupled with the first probe pad through a fourth electrical connection on the first surface;
the fifth bump is electrically coupled with the second probe pad through a fifth electrical connection on the first surface; and
the fourth bump is electrically coupled with the fifth bump through a sixth electrical connection which is substantially encapsulated by the redistribution layer.

14. The interposer of claim 10, wherein:
the first bumps are arranged in an octagonal fashion around the first probe pad.

15. The interposer of claim 14, wherein:
the second bumps are arranged in an octagonal fashion around the second probe pad.

16. An interposer for a 3-dimensional integrated circuit (3D IC) package system, the interposer comprising:
a substrate;
a redistribution layer on the substrate;
the redistribution layer having a first surface opposite the substrate and a plurality of electrical paths; and
the substrate having a second surface opposite the redistribution layer;
first bumps having a first dimension on the first surface;
first vias within the redistribution layer, the first vias being electrically coupled with corresponding ones of the first bumps;
at least one first electrical connection electrically coupling together the first vias;
first through-silicon-via (TSV) structures within the interposer, the at least one first TSV structures being electrically coupled to corresponding ones of the first vias;

wherein the first bumps are electrically coupled to corresponding ones of the first TSV structures through corresponding ones of the first vias;

second bumps having the first dimension on the first surface;

second vias within the redistribution layer, the second vias being electrically coupled to corresponding ones of the second bumps;

at least one a second electrical connection electrically coupling together the second vias;

second TSV structures within the interposer, the second TSV structures being electrically coupled corresponding ones of the second vias;

wherein the second bumps are electrically coupled to corresponding ones of the second TSV structures through corresponding ones of the second vias; and a third electrical connection, on the first surface, electrically coupling together at least one of the first bumps and at least one of the second bumps; and wherein the at least one of the first TSV structures is electrically coupled to a corresponding at least one of the second TSV structures through a corresponding at least one of the first vias, the third electrical connection and a corresponding at least one of the second vias; and wherein at least an entirety of one of the first vias and a corresponding at least one of the first TSV structures are substantially coaxially aligned in a direction which is orthogonal to the first surface.

17. The interposer of claim 16, further comprising:

a fourth bump having the first dimension disposed on the first surface, the fourth bump being electrically coupled with a first probe pad; and a fifth bump having the first dimension disposed on the first surface, the fifth bump being electrically coupled with a second probe pad, the fifth bump also being electrically coupled with the fourth bump.

18. The interposer of claim 17, wherein:

the fourth bump is electrically coupled with the first probe pad through a fourth electrical connection on the first surface;

the fifth bump is electrically coupled with the second probe pad through a fifth electrical connection on the first surface; and the fourth bump is electrically coupled with the fifth bump through a sixth electrical connection in the redistribution layer.

19. The interposer of claim 16, wherein:

the first bumps are arranged in an octagonal fashion around the first probe pad.

20. The interposer of claim 19, wherein:

the second bumps are arranged in an octagonal fashion around the second probe pad.

* * * * *